United States Patent [19]

Suzuki

[11] Patent Number: 4,591,917
[45] Date of Patent: May 27, 1986

[54] SOLID STATE IMAGE SENSOR
[75] Inventor: Nobuo Suzuki, Yokohama, Japan
[73] Assignee: Tokyo Shibaura Denki Kabushiki Kaisha, Kawasaki, Japan
[21] Appl. No.: 539,424
[22] Filed: Oct. 6, 1983
[30] Foreign Application Priority Data
Oct. 7, 1982 [JP] Japan ................. 57-176663
[51] Int. Cl.[4] .......................... H04N 3/15
[52] U.S. Cl. .................... 358/213; 358/909
[58] Field of Search .......... 358/213, 212, 225; 357/24 LR

[56] References Cited

U.S. PATENT DOCUMENTS

| 4,178,614 | 12/1979 | Sauer | 358/213 |
|---|---|---|---|
| 4,336,556 | 6/1982 | Sekine | 358/213 |
| 4,392,158 | 7/1983 | Aoki | 358/213 |
| 4,420,773 | 12/1983 | Toyoda | 358/213 |
| 4,426,664 | 1/1984 | Nagumo | 358/213 |
| 4,443,818 | 4/1984 | Ohba | 358/213 |
| 4,455,575 | 6/1984 | Murakoshi | 358/213 |
| 4,463,383 | 7/1984 | Soneda | 358/213 |
| 4,472,741 | 9/1984 | Takatsu | 358/213 |
| 4,486,783 | 12/1984 | Tanaka | 358/909 |
| 4,489,351 | 12/1984 | d'Alayer | 358/909 |
| 4,500,924 | 2/1985 | Ohta | 358/213 |
| 4,504,866 | 3/1985 | Saito | 358/213 |
| 4,541,010 | 9/1985 | Alston | 358/44 |

FOREIGN PATENT DOCUMENTS

| 54126994 | 5/1981 | Japan | 358/909 |
|---|---|---|---|
| 2065974 | 12/1980 | United Kingdom . | |

OTHER PUBLICATIONS

Kovac et al., "Design, Fabrication, and Performance of A 128×160 Element Charge-Coupled Image Sensor" (1973) Especially FIGS. 1,2, & 3, and pp. 38 and 39 (Taken from Proc. of CCD Appl. Conf. (San Diego)).

Primary Examiner—Gene Z. Rubinson
Assistant Examiner—L. C. Schroeder
Attorney, Agent, or Firm—Schwartz, Jeffery, Schwaab, Mack, Blumenthal & Evans

[57] ABSTRACT

A solid state image sensor is constituted so as to transfer signal charges produced in response to optical irradiation to readout means (22) provided at the end in the direction of alignment of the transfer electrodes with charge transfer channels (30) located below a plurality of transfer electrode array (27) arranged on a semiconductor wafer (20) through an insulating film (32) and to output them from the readout means. The solid state image sensor is provided with means for controlling applied voltage comprising voltage sources (37, 38) of low and high voltages, multi-phase clock source (36) and switch means (34). The applied voltage control means, at a time period of optical irradiation, is operative to apply a voltage to form a deep potential well in transfer channels located below either odd number of transfer electrodes or even number thereof, and form a potential barrier in the transfer channels located below the other electrodes, thereby to store signal charges in the potential well. Further, this applied voltage control means, at a time period of signal readout in a light-interrupted condition, is operative to apply charge transfer multi-phase clocks from transfer electrodes closest to signal readout means sequentially towards those located apart therefrom.

11 Claims, 10 Drawing Figures

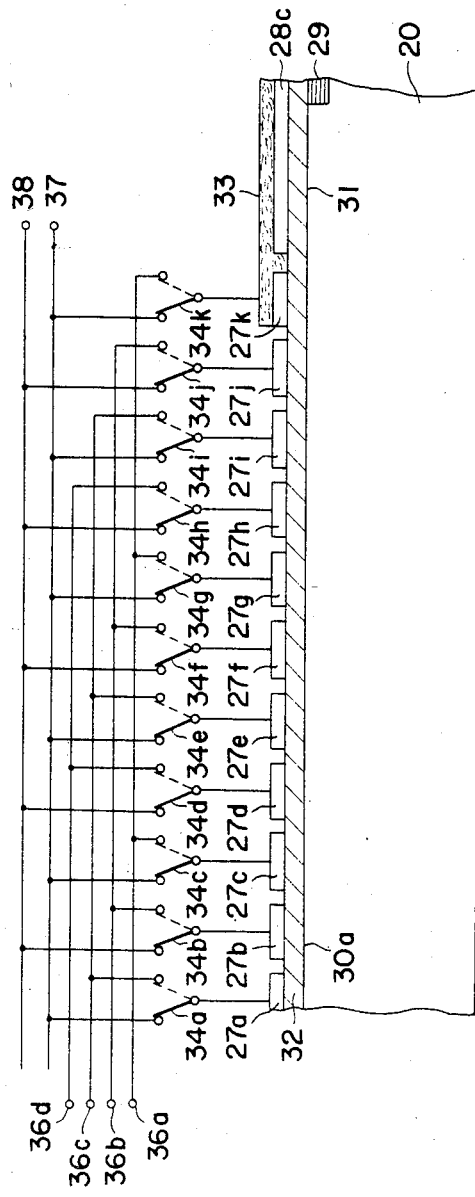
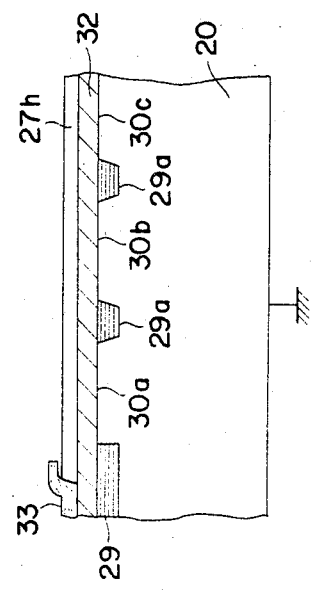

SOLID STATE IMAGE SENSOR

BACKGROUND OF THE INVENTION

The present invention relates to a solid state image sensor, and more particularly to a charge-transfer type area image sensor.

Recently, instead of prior art optical cameras, development or research in regard to electronic cameras has become active. The term electronic cameras is used to refer to devices similar to, for example, a TV (Television) camera. Namely, electronic cameras comprise a solid state image sensor arranged on a portion corresponding to a film surface of an optical camera, to convert an optical signal into an electric signal with the solid state image sensor and a magnetic memory medium to store or write the electric signal, wherein the electronic cameras are not provided with a shutter mechanism in their optical system. The information thus stored can be changed into a hard copy, e.g. photograph obtainable with, such as, prior art optical cameras. Alternatively, the information thus stored can be changed into a soft copy, e.g. indication on a CRT (Cathode Ray Tube) display unit.

Reference is made to the detail of the electronic camera organization in which the technological starting point lies in the TV camera as stated above. In this instance, in lieu of using a shutter required for an optical camera, a photosensitive area and a storage area are provided in the image sensor. Thus, image information of an entire picture area sensed at the photosensitive area is transferred to the storage area within an extremely short time period. Then, the concerned signal is output from the storage area by means of signal readout means. As a result, the prior art image sensors require a photosensitive area and a storage area, resulting in a large size thereof.

SUMMARY OF THE INVENTION

With the above in view, an object of the present invention is to provide a solid state area image sensor having small chip size and high resolution.

To achieve the object stated above, a solid state area image sensor according to the present invention is based on the structure in which an optical system including a shutter is combined therewith. The solid state area image sensor of the invention is characterized in that there is formed a plurality of transfer electrodes on a semiconductor wafer through an insulating film, and that the area image sensor is provided with applied voltage control means, the applied voltage control means, at a time period of optical irradiation, being operative to apply a voltage to form a deep potential well in a transfer channel formed below each electrode constituting one group of electrodes corresponding to either a first group (the odd group) of every other transfer electrodes or a second group (the even group) of transfer electrodes not included in the first group, and to form a potential barrier in a transfer channel formed below each electrode constituting the second group of electrodes, thereby storing signal charges in the potential well, while the applied voltage control means, when a signal is read out by means of signal readout means in a light-interrupted condition, is operative to apply charge transfer clocks from transfer electrodes located closer to the signal readout means towards those subsequently located apart therefrom.

According to the present invention thus constructed, signal charges produced in response to incident light are stored in a potential well formed within transfer channels below each electrode comprising a member of either of odd group of transfer electrodes or an even group thereof together constituting a plurality of transfer electrodes. The signal charges thus stored are read out subsequently from the transfer electrodes located closer to the signal readout means. Accordingly, the device of the invention does not require the storage area indispensable in the prior art. As a result, the chip-occupied area is reduced to one half, thereby making it possible to make devices, to which the area image sensor of the invention is applied, small-sized and to reduce the cost of the image sensor and the applied devices.

Further, according to the present invention, one picture element is defined by two transfer electrodes. As a result, the resolution with the area image sensor of the invention is two times higher than that with the prior art solid state area image sensor.

Thus, the present invention can provide a solid state area image sensor having small chip size and high resolution.

BRIEF DESCRIPTION OF THE DRAWINGS

FIG. 5 is a cross sectional view taken along the lines A'—A' in FIG. 4;

FIG. 6 is a cross sectional view taken along the lines B'—B' in FIG. 4;

DETAILED DESCRIPTION OF THE INVENTION

Figure 1:
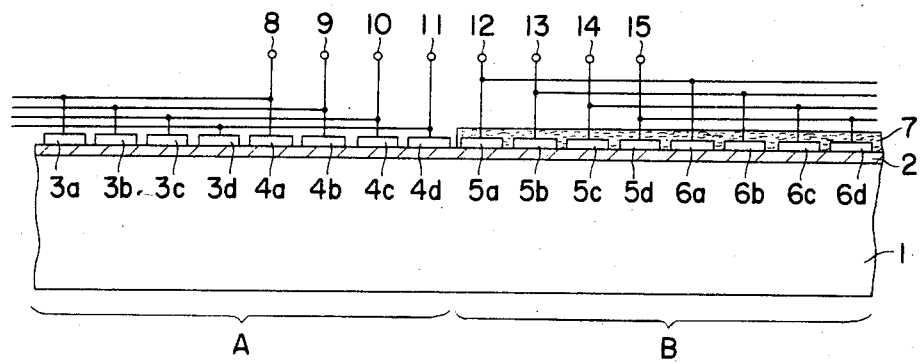
FIG. 1 is a partial cross sectional view illustrating a prior art solid state area image sensor.

Prior to the description in connection with the present invention, reference is first made to a prior art image sensor for an electronic camera taken in conjunction with FIG. 1. Thereafter, the preferred embodiments according to the present invention will be described with reference to FIGS. 2 to 10.

As a solid state image sensor for use in the above-mentioned electronic cameras, there is generally employed a charge transfer type area image sensor in which frame transfer organization is adopted. An example of the charge transfer area image sensor based on the frame transfer organization is shown in FIG. 1.

The image sensor shown in FIG. 1 is a four-phase driving type image sensor. The image sensor roughly comprises a photosensitive area A, a storage area B for storing charges based on the fact that charges created or produced due to the photosensitive action in the photosensitive area A are transferred thereto within an extremely short time period, and an output register (not shown). A plurality of transparent electrodes (transfer electrodes) 3a to 3d, 4a to 4d, 5a to 5d, and 6a to 6d are arranged closely to each other on a P-type semiconductor wafer 1 through an insulating film 2. The regions 3a to 3d, and 4a to 4d form or define the photosensitive area A. The regions 5a to 5d, and 6a to 6d form the storage area B. The photosensitive area A receives light through the respective transparent electrodes 3a to 3d, and 4a to 4d. Thus, surface areas of the P-type wafer 1 below four electrodes serve as a unit photosensitive picture element. In the storage area B, elements are formed wherein the number thereof is the same as that of the sensitive picture elements in the photosensitive area A. Accordingly, the number of the transparent electrodes is the same in the both areas. Further, the area of portions A and B is the same. Reference numeral 7 denotes an optical shielding film.

The operation thereof is as follows: When an optical signal is received, a high level voltage $V_H$ is applied to, for instance, terminals 8 and 9, respectively, and a low level voltage $V_L$, is applied to terminals 10 and 11, respectively. Thus, an electric potential well (which is called solely "potential well" for brevity hereinafter) is formed in the P-type semiconductor wafer 1 below the transparent electrodes 3a and 3b, and 4a and 4b. The signal charges produced in response to the optical signal are stored within the potential well. Then, in order to output the signal charges thus stored, the four-phase clock pulses are applied to the terminals 8 to 11, and 12 to 15, respectively. Thus, the signal charges stored are transferred from the photosensitive area A to the storage area B. The signal charges transferred to the storage area B are subjected to parallel-to-serial conversion in an output register (not shown) in synchronism with each scanning line, whereby serial signals are read out therefrom.

As stated above, the prior art area image sensor requires that the storage area B has the same area as that of the photosensitive area A. This results in a large sized chip. The miniaturization of the device in which such an image sensor is assembled is limited and the cost thereof increases.

Further, with the prior art image area sensor, one picture element is defined by four transfer electrodes, such as denoted by 3a, 3b, 3c, and 3d. As a result, this makes it difficult to increase the number of the picture elements. Accordingly, high resolution cannot be expected. For this reason, the prior art area image sensor is not suitable for an electronic camera which requires high resolution.

Figure 2:
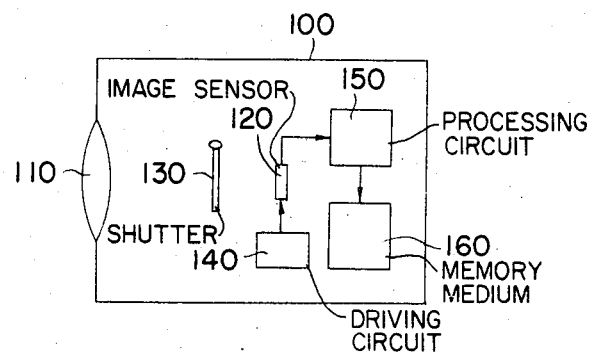
FIG. 2 is a block diagram schematically illustrating an electronic camera to which a solid state area image sensor according to the present invention is applied.

Referring now to FIG. 2, there is shown an electronic camera to which the present invention is applied. Reference numeral 100 denotes an outer casing or vessel of the electronic camera, wherein there is provided an optical lens 110 in front thereof. Within the outer vessel 100, there are arranged along the optical axis of the optical lens 110, a shutter 130, and a solid state area image sensor 120 according to the present invention behind the shutter 130. The solid state area image sensor 120 is driven in accordance with various timings referred to later, fed from a driving circuit 140, thereby to produce charged signals in response to an incident light and store them in correspondence with the opening and closing operation of the shutter 130 being effected at a predetermined timing. The charged signals are sequentially read out from the area image sensor 120, and then are processed in a signal processing circuit 150. The charged signals thus processed are stored into a memory medium 160, such as, a magnetic disk, a magnetic tape or a magnetic card. With the information stored in the memory medium 160, the user of this electronic camera can regenerate an image in a suitable manner. For instance, he can prepare a hard copy, or a soft copy on a suitable display unit.

Figure 3:
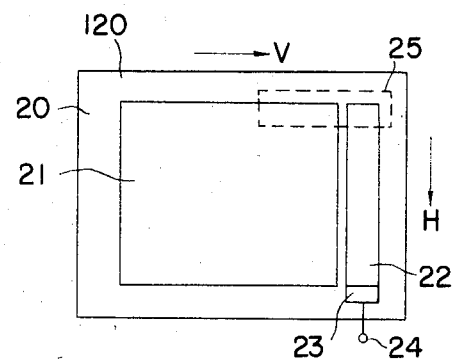
FIG. 3 is a plan view schematically illustrating a solid state area image sensor according to the present invention.
Figure 4:
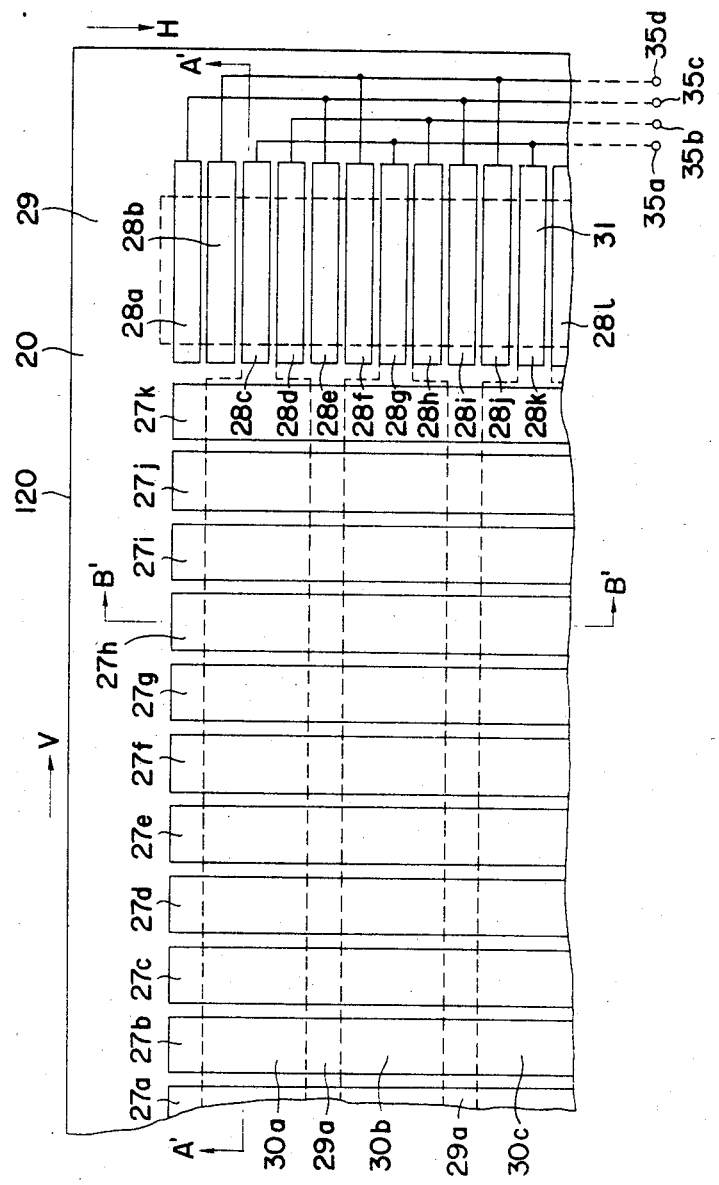
FIG. 4 is a partially enlarged plan view showing in an exaggerated manner a portion denoted by reference numeral 25 in FIG. 3.

Referring to FIG. 3, there is shown the solid state area image sensor 120. A photosensitive area 21, CCD (Charge-Coupled-Device) type horizontal charge transfer shift register 22 (which will be called "horizontal register" hereinafter), an output circuit 23, and an output terminal 24 are provided on a P-type semiconductor wafer (which will be called "wafer"). For the purpose of illustrating the solid state area image sensor 120 in detail, the extended view of a portion (broken line portion) designated by reference numeral 25 of FIG. 3 is shown in FIG. 4. Further, the cross section taken along the lines A'—A' of FIG. 4 is shown in FIG. 5, and the cross section taken along the lines B'—B' of FIG. 4 is shown in FIG. 6.

Referring to FIGS. 4 to 6, a region 29 of P+ conductivity type (which will be referred to "P+ region 29" hereinafter) is provided on the side of the principal surface of the wafer 20. P+ regions 29a corresponding to the photosensitive area 21 are arranged at a predetermined interval in the horizontal direction labelled by H in order to form transfer channels 30a to 30c to be referred to later (FIG. 6). Further, a plurality of transparent transfer electrodes 27a to 27k are arranged in a vertical direction labelled by V on the wafer 30 through an insulating film 32 in a manner to be perpendicular to the respective P+ regions 29a. Thus, the photosensitive area is formed. Likewise, a plurality of transfer electrodes 28a to 28l are arranged in a horizontal direction H on the wafer 30 through the insulating film 32 on the one side in the alignment direction V of the transparent transfer electrodes 27a to 27k (that is, the next portion on the right side of the transparent transfer electrode 27k). Thus, the horizontal register 22 is formed. Each of transfer electrodes 28a to 28l and the transparent transfer electrode 27k are optically shielded by an optical shielding film 33 (FIG. 5). Further, the concerned electrodes combined at four intervals among transfer electrodes 28a to 28l are connected to the terminals 35a to 35d, respectively (FIG. 4). On the other hand, as shown in FIG. 5, transparent transfer electrodes 27a to 27k are selectively changeably coupled to terminals 36a to 36d, 37 or 38 through electronic switches 34a to 34k.

The operation thereof will be described with reference to FIGS. 3 to 6.

[Phase A]

Assume that the shutter 130 of the electronic camera is placed in closed condition. In this phase A, a predetermined preparatory operation required before the shutter 130 is opened, is effected as follows: The draining or drawing-off operation is effected in connection with the signal charges and noise charges (dark currents or charges occurring when the driving circuit is initially energized) which are extant in areas below each of transparent transfer electrodes 27a to 27k in the photosensitive area 21 and transfer electrodes 28a to 28l in the horizontal register 22 (which areas corresponds to the principal surface of wafer 20). More particularly, when this operation is effected the electronic switches 34a to 34k are stitched to the right (the side shown by dotted lines in FIG. 5). Four-phase clock pulses are applied to the terminals 36a to 36d, and 35a to 35d, respectively. After the draining operation is completed, the electronic switches 34a to 34k are all switched to the left (the side shown by solid lines in FIG. 5). An electric potential $V_L$ of ground level is applied to the terminal 37, which potential is the same as that applied to the wafer 20. Further, a predetermined positive voltage $V_H$ is applied to the terminal 38. As a result, a potential well is formed in the transfer channels 30a, 30b and 30c below the transparent transfer electrodes to which the positive voltage $V_H$ is applied, such as 27b, 27d, 27f, 27h and 27j, which corresponds to a group of odd-numbered or even-numbered transparent electrodes if the electrodes were numbered consecutively. On the other hand, a potential barrier is formed in the transfer channels below a second group of transparent transfer electrodes 27a, 27c, 27e, 27g, 27i, and 27k respectively interposed between transparent electrodes 27b, 27d, 27f, 27h and 27j.

[Phase B]

When the shutter 130 of the electronic camera is opened, an incident optical signal is focused into an image at the photosensitive area 21. The optical signal passes the transparent transfer electrodes 27a to 27k and then reaches the surface of the wafer 20 to produce an electron-positive hole pair. The signal charges serving as the electron thus produced are stored into the potential well formed in the transfer channels 30a, 30b and 30c. After a predetermined photosensitive time elapses, the shutter 130 is closed. Thus, the signal charges proportional to the photo intensity of the incident light are stored in the potential well.

[Phase C]

This phase is a time period during which the stored signal charges are read out. First, the electronic switches 34j and 34k corresponding to the line closest to the horizontal register 22 (which line will be called "first line" hereinafter) are switched to the right (shown by broken line). In this condition, one cycle of four-phase clock pulses for vertical transfer is applied to the terminals 36a, 36b, 36c and 36d. The signal charges which have been stored in the transfer channels 30a to 30c located in areas below the transparent transfer electrode 27j are transferred to the horizontal register 22. In this instance, the positive voltage $V_H$ is applied to the terminal 35a and at least one of the terminals 35b to 35d is placed in ground level $V_L$. Then, under the condition that the terminals 36a and 36b are placed in ground level $V_L$ and the terminals 36c and 36d are placed in the positive level $V_H$ (which condition will be called "latching condition" hereinafter), the signal charges corresponding to one scanning line are read out by applying four-clock pulses for horizontal transfer to the terminals 35a to 35d.

Thereafter, the signal charges on the second line (the transparent electrodes 27h and 27i) are read out. To effect this, first, the electronic switches 34h and 34i are switched to the right and the clock pulses for vertical transfer corresponding to the phase of 180° are applied to the terminals 36a to 36d. Thus, the signal charges which have been stored below the transparent transfer electrode 27h are transferred to the transparent transfer electrodes 27j and 27k to which the positive electric potential $V_H$, is applied. Then, after the electronic switches 34f and 34g are switched to the right, the clock pulses for vertical transfer corresponding to the phase of 180° are applied thereto. This application of the clock pulses causes the signal charges on the second line to be transferred to the horizontal register 22. At the same time, the signal charges on the third line (27f, 27g) are stored below the transparent transfer electrodes 27h and 27i. Further, the signals on the fourth and fifth lines (27b, 27d) are stored in the transparent transfer electrodes 27b and 27d. Then, the latch operation of the clock pulses for vertical transfer is effected. At this time, the clock pulses for horizontal transfer are applied to the terminals 35a to 35d, thereby to read out the signal charges on the second line. The signals on the third line and the subsequent lines are sequentially read out in accordance with the same procedure.

In this instance, the switching signals in respect to the electronic switches 34a to 34k, and the signals in respect to the terminals 35a to 35d, 36a to 36d, 37 and 38 are fed from the driving circuit 140 (FIG. 2), respectively.

As appreciated from the foregoing description, the solid state area image sensor 120 according to the present invention has no area constraint encountered with the prior art (FIG. 1) which requires a storage area having the same area as that of the photosensitive area. Namely, the chip size constituting the solid state area image sensor of the invention is reduced approximately to one half. Further, according to the invention, one picture element is formed by two electrodes. In this respect, with the prior art, one picture element is formed by four electrodes. Accordingly, the resolution obtained with present invention is two times higher in resolution than that with the prior art.

[The modification of the invention]

Figure 7:
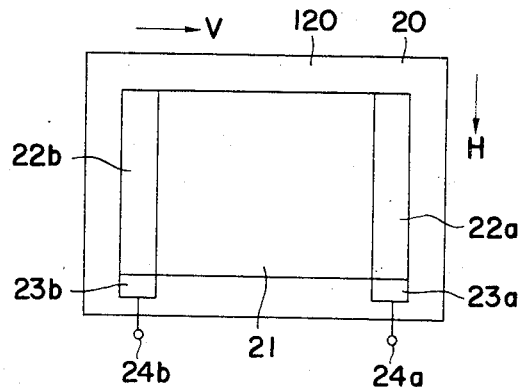
FIG. 7 is a plan view illustrating another example of a solid state area image sensor with the provision of two signal readout means.

In the above-mentioned embodiment, the invention has been described using an example that the single horizontal charge transfer type shift register 22 is provided at the one side in the vertical direction V (FIG. 3). However, two shift registers may be provided at the both sides of the photosensitive area 21, respectively, as shown in FIG. 7. Like reference numerals denotes the parts or component identical or similar to FIG. 3. In this instance, the readout operation is effected as follows: The signal charges corresponding to the right-half of the photosensitive area 21 are read out with the horizontal register 22a located at the right side. On the other hand, the signal charges corresponding to the left-half thereof are read out with the horizontal register 22b located at the left side. Thus, the transfer speed of the signal charges is raised, thereby making it possible to effect high speed processing.

In the above-mentioned embodiment, four-phase surface channel CCD is used as a horizontal charge transfer type shift register 22. However, single-phase, two-phase or three-phase driving type CCD, embedded channel CCD (which is also referred to "BCCD") or BBD (Bucket Brigade Device) may be used for this purpose.

Figure 8:
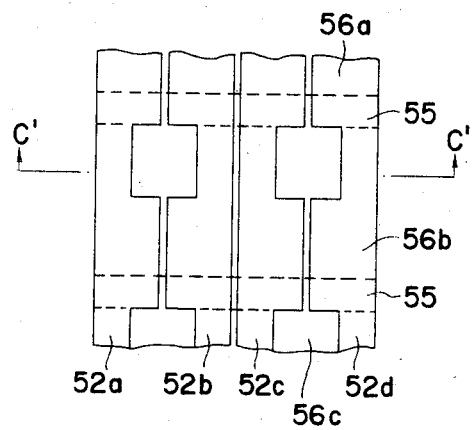
FIG. 8 is a partial enlarged view illustrating modification of the photosensitive area.
Figure 9:
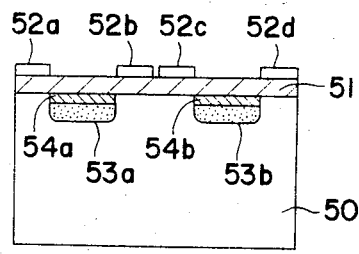
FIG. 9 is a cross sectional view taken along the lines C'—C' in FIG. 8.

Further, in the embodiment, MOS structure using the transparent electrode is utilized for forming a photosensitive picture element. However, for instance, P-N junction type photodiode as shown in FIGS. 8 and 9 may be used. FIG. 8 is a plan view partially showing a part of the photosensitive area. FIG. 9 is a cross sectional view taken along the lines C'—C' of FIG. 8. Referring to FIGS. 8 and 9, P-type island semiconductor regions 54a and 54b and N-type island semiconductor regions 53a and 53b are provided in the P-type semiconductor wafer 50. Thus, P-N junction type photodiode is formed. The transfer electrodes 52a to 52d are provided on the surface of the wafer 50 through an insulating film 51. Reference numeral 55 denotes a P+ semiconductor region, and reference numerals 56a to 56c denote charge transfer channels, respectively. With the construction thus formed, electrons produced from the P-N junction photodiode constituted by the N-type regions 53a and 53b, and the P-type regions 54a and 54b are stored in a potential well below the transfer electrodes 52a and 53c to which a positive voltage $V_H$ is applied. The remaining operations are analogous to that of FIG. 4. In this embodiment, the transfer electrodes 52a to 52d may be opaque. Further, solely the P-N junction diode may be covered with an optical shielding film having an opening therein.

Furthermore, it is not necessary that the transfer of the signal charges in the photosensitive area 21 be effected in accordance with four-phase clock pulses. For instance, they may be driven in accordance with single-phase, two-phase, three-phase or more than five-phase clock pulse.

Figure 10:
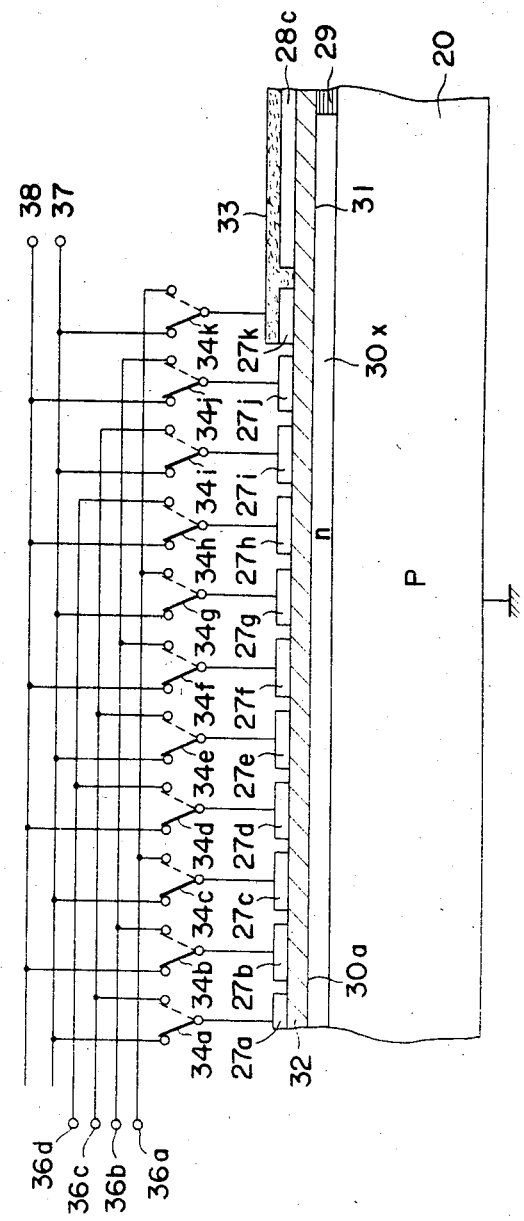
FIG. 10 is a cross sectional view similar to FIG. 5, illustrating a further example of a solid state image sensor in which transfer channels are constituted as buried channels.

The transfer channel may be of a buried channel. FIG. 10 is a cross sectional view, similar to FIG. 5, in which the transfer channels are constituted with the buried channel.

What is claimed is:

1. A solid state image sensor in which charge transfer channels are formed below an array, said array comprising an alternating succession of first and second transfer electrodes of a plurality of transfer electrodes aligned in a first direction, on a semiconductor wafer through an insulating film, the charge transfer channels allowing signal charges produced as an output of photoelectric converting means responsive to optical irradiation to be transferred to signal readout means having a first side adjacent to the transfer electrode array for defining the charge transfer channels to output the signal charges therefrom,
the improvement comprising means for controlling applied voltage, wherein:
(a) during optical irradiation of said photoelectric converting means, said applied voltage controlling means applies a voltage to form a deep potential well in a transfer channel below said first electrodes, and to form a potential barrier in a transfer channel located below said second electrodes, thereby to store signal charges in said potential well, and
(b) during reading out of said signal charges by means of signal readout means after illumination of said photoelectric converting means, said applied voltage control means applies a charge transfer multiphase clock to a pair of first and second transfer electrodes adjacent to the signal readout means and sequentially applies a charge transfer multiphase clock to each successive pair of first and second transfer electrodes, to effect a readout.

2. A solid state image sensor according to claim 1, wherein said applied voltage control means comprises voltage source means for supplying voltages thereby to form said deep potential well and potential barrier, multi-phase clock source means for supplying transfer clocks, and electronic switch means for switching the voltage supplied from said voltage source means and said transfer clocks.

3. A solid state image sensor according to claim 1, wherein said transfer electrodes are comprised of transparent electrodes.

4. A solid state image sensor according to claim 1, wherein said signal readout means is provided at said first side in the direction of alignment of the transfer electrode array for defining the charge transfer channels.

5. A solid state image according to claim 1, wherein said signal readout means is provided at said first side of said transfer electrode array in the direction of alignment of the transfer electrode array for defining the charge transfer channels, and a second signal readout means is provided at a second side of said transfer electrode array in the direction of alignment of the transfer electrode array for defining the charge transfer channels.

6. A solid state image sensor according to claim 1, wherein said photoelectric converting means is comprised of a photodiode of P-N junction type, said diode being arranged in the vicinity of said transfer electrodes.

7. A solid state image sensor according to claim 1, wherein said transfer channel is formed with a buried channel.

8. A solid state image sensor according to claim 1, wherein said photoelectric converting means comprises a shutter for interrupting light irradiated on said photoelectric converting means.

9. A solid state image sensor according to claim 1, wherein each of said signal charges produced by said photoelectric converting means is stored in two of said transfer electrodes.

10. The solid state image sensor of claim 1, wherein said readout means is comprised of a plurality of third transfer electrodes disposed substantially perpendicular to said first and second transfer electrodes.

11. A method of sensing an image comprising the steps of:
(a) draining signal charges and noise charges from a plurality of transfer channels disposed below a photosensitive element;
(b) forming potential walls in a first group of said transfer channels;
(c) forming potential barriers in a second group of said transfer channels;
(d) arranging the transfer channels of said first group of transfer channels in alternating succession with the transfer channels of said second group of transfer channels to form adjacent pairs of barrier-well transfer channels;
(e) exposing said photosensitive element to an incident optical signal;
(f) reading out signal charges into a readout device, from a first pair of transfer electrodes superposed above a first adjacent pair of transfer channels immediately adjacent said readout device; and
(g) reading out signal charges from additional successive pairs of transfer electrodes superposed above successive adjacent pairs of transfer channels.

* * * * *